United States Patent [19]
Telkamp

[11] Patent Number: 6,116,463
[45] Date of Patent: Sep. 12, 2000

[54] HIGH-SPEED SEMICONDUCTOR SLUICE ASSEMBLY AND METHOD FOR PASSING A SEMICONDUCTOR CHIP THERETHROUGH

[76] Inventor: Arnold T. M. Telkamp, Laarweg 7, 6882 AA, Velp (GLD), Netherlands

[21] Appl. No.: 09/129,684

[22] Filed: Aug. 5, 1998

[51] Int. Cl.[7] .............................. B65G 59/00; B65H 3/30; G07F 11/16
[52] U.S. Cl. ..................... 221/298; 221/123; 221/124; 221/299
[58] Field of Search .................................... 221/123, 124, 221/251, 298, 299; 198/463.6

[56] References Cited

U.S. PATENT DOCUMENTS

| | | | |
|---|---|---|---|
| 3,799,395 | 3/1974 | Vanderpool | 221/298 X |
| 3,820,648 | 6/1974 | Halvorsen | 198/463.6 |
| 4,377,368 | 3/1983 | Koch | 221/298 X |
| 4,874,080 | 10/1989 | Wroblewski | 221/298 X |
| 5,154,277 | 10/1992 | Murakami | 198/463.6 |
| 5,259,723 | 11/1993 | Willis et al. | 198/463.6 X |
| 5,397,025 | 3/1995 | Lee | 221/298 X |
| 5,860,505 | 1/1999 | Metzger | 198/463.6 X |

*Primary Examiner*—Christopher P. Ellis
*Assistant Examiner*—Gene O. Crawford
*Attorney, Agent, or Firm*—Paul W. Davis; Janine R. Novatt; Harry M. Weiss & Associates, P.C.

[57] ABSTRACT

A high-speed sluice assembly and method for transporting semiconductor devices includes a slide along which the semiconductor devices are transported and two independently controlled stoppers which control the transport of the semiconductor devices along the slide. Each of the independently controlled stoppers is connected to a separate actuator. Each of the actuators is also independently controlled. Several sensors are coupled to the slide to determine the position of the semiconductor devices as they are transported along the slide.

15 Claims, 4 Drawing Sheets

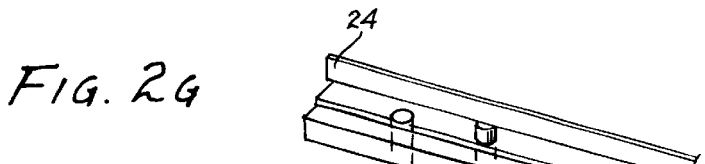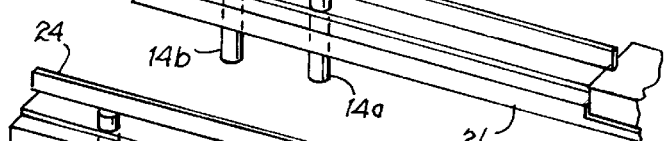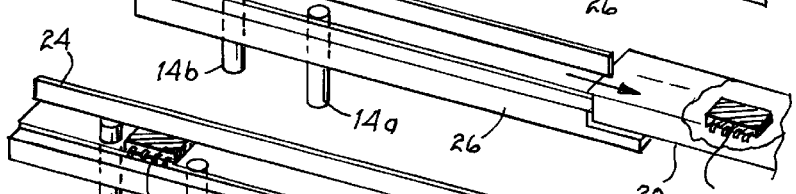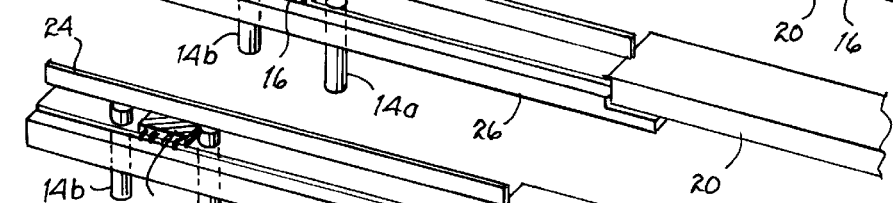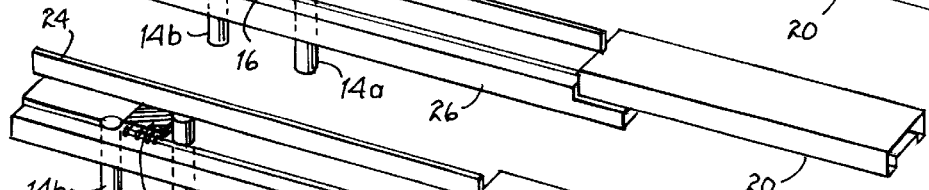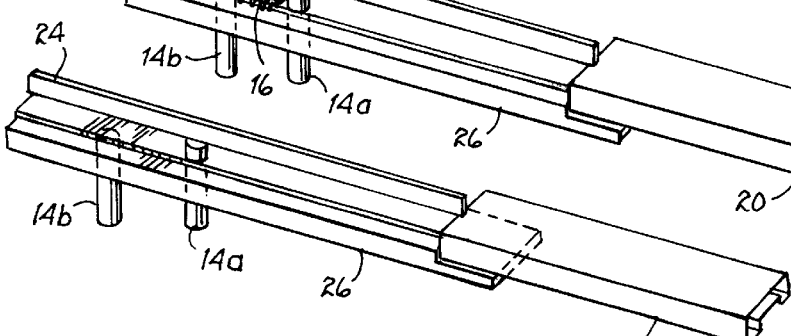

HIGH-SPEED SEMICONDUCTOR SLUICE ASSEMBLY AND METHOD FOR PASSING A SEMICONDUCTOR CHIP THERETHROUGH

FIELD OF THE INVENTION

This invention relates generally to semiconductor processing equipment and more particularly to a high-speed semiconductor sluice assembly and method for passing a semiconductor chip therethrough.

BACKGROUND OF THE INVENTION

A semiconductor sluice assembly regulates the controlled movement of semiconductor chips through a guide called a "slide" into and from a magazine called a "tube". The slide includes a bottom guide and a top guide to prevent movement of the semiconductor chips other than into or from the tube i.e. to prevent movement other than in-line with the slide. When the semiconductor chips are out of their leadframe (the carrier of the semiconductor chips), they have to be moved individually. For example, they must be moved individually after they are separated from their leadframe in the separation tool. This movement can be done by air-jet, mechanically, by gravity or by a combination thereof. For example, the semiconductor chips are moved out of the separation tool mechanically to the slide after which gravity takes over to move the semiconductor chips. At critical points, air-jets are placed to help gravity. Such critical points include where the semiconductor chips have to be moved from a zero velocity situation (like in the sluice assembly), or where semiconductor chips can jam each other (like the points where semiconductor chips are collected to batches or because of mispositioning of parts) (like the movement of the semiconductor chip in the slide into or from the tube).

The maximum speed of existing semiconductor chip processing systems using a sluice assembly is often limited to the speed of the sluice assembly. This is particularly problematic in systems in which the sluice assembly has to handle one semiconductor chip at a time, e.g., on- and offloaders for testers, onloaders for packing systems; offloaders for trim & form systems, etc. The processing system is too slow. Moreover, in some conventional systems, the semiconductor chips are held in the sluice assembly until there is a batch with a certain number, for example, offloaders for trim & form systems. This gives the sluice assembly enough time to operate. The semiconductor chips move into the tube when the batch is full. Unfortunately, the number of semiconductor chips in the tube is a multiple of the number per batch. With multiple batches, the number of semiconductor chips in the tube cannot be equal to a prime number. Moreover, sensors may detect that there are semiconductor chips passing into the tube but cannot detect how many. Therefore, there may be one or more semiconductor chips jammed and undetected on the slide. In addition, the semiconductor chips push up against each other, risking jamming.

Accordingly, there has been a need for a novel semiconductor sluice assembly and method that let through one by one at least one semiconductor chip through the sluice assembly. There is a further need for a sluice assembly and method that operate at high speed to permit the handling of one semiconductor chip at a time without limiting the speed of the system. Such a sluice assembly and method are also needed in which the number of semiconductor chips in the tube is a multiple of one so any number of semiconductor chips, including prime numbers, is possible. Additionally, a sluice assembly and method are needed so that only one semiconductor chip exits the slide at a time so that if the sensor detects that a semiconductor chip has gone into the tube, one knows there is no semiconductor chip jammed in the slide. Further, a sluice assembly and method are needed which substantially eliminate the risk of semiconductor chips jamming in the slide by pushing up against each other. The present invention fulfills these needs and provides other related advantages.

SUMMARY OF THE INVENTION

In accordance with this invention, it is an object of this invention to provide a high-speed semiconductor chip sluice assembly and a method for passing a semiconductor chip therethrough, which permit the let through of one semiconductor chip at a time.

It is another object of this invention to provide a high-speed semiconductor sluice assembly and method, which permit handling of semiconductor chips in single row and multi-row (e.g. matrix leadframes) configuration.

It is another object of this invention to provide a high-speed semiconductor chip sluice assembly and method, which permit the handling of any number of semiconductor chips.

It is a further object of this invention to provide a high-speed semiconductor chip sluice assembly and method, which substantially prevent semiconductor chips from jamming in the slide and tube.

It is yet another object of this invention to provide a high-speed semiconductor chip sluice assembly and method, which substantially prevent the risk of undetected jamming of semiconductor chips.

It is a still further object of this invention to provide a high-speed semiconductor chip sluice assembly and method, which are relatively high speed making them compatible with high-speed systems.

In the preferred embodiment, the high-speed semiconductor chip sluice assembly comprises, generally, a pair of electromagnets coupled to a pair of stoppers for controlling movement thereof to regulate the flow one at a time of at least one semiconductor chip through a slide into or from a tube.

Each one of the pair of electromagnets is coupled to one of the pair of stoppers by a lever. Each of the levers includes a first end and a second end. The electromagnets each include a coil and an associated kernel. An upper end of each of the kernels is connected by a first hinge pin to the first end of each of the levers. The second end of each of the levers is connected by a second hinge pin to a lower end of each of the stoppers. The kernels move substantially vertically into and out of their associated coils in an alternating sequence. Movement of the kernel out of the coil causes downward movement of the coupled stopper. Movement of the kernel into the associated coil causes upward movement of the coupled stopper. Kernel movement may be controlled by placing an electrical current on the associated coil, the direction of kernel movement dependent on the direction of current. Kernel movement into the coil may also be controlled by turning off the current and using a mechanical spring.

In alternate embodiments, actuator means other than electromagnets may be used for driving the stoppers up and down for controlled let through of one semiconductor at a time through a portion of the slide.

The slide includes a conventional top and bottom guide to prevent the at least one semiconductor chip from moving in any other direction other than the one to or from the tube.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIGS. 2A–2G are operational perspective views illustrating different sequential positions of the stoppers, in one sluice assembly cycle, of the same sluice assembly as one semiconductor chip in one row moves through the slide into a tube or magazine.

DETAILED DESCRIPTION OF THE PREFERRED EMBODIMENTS

Figure 1:
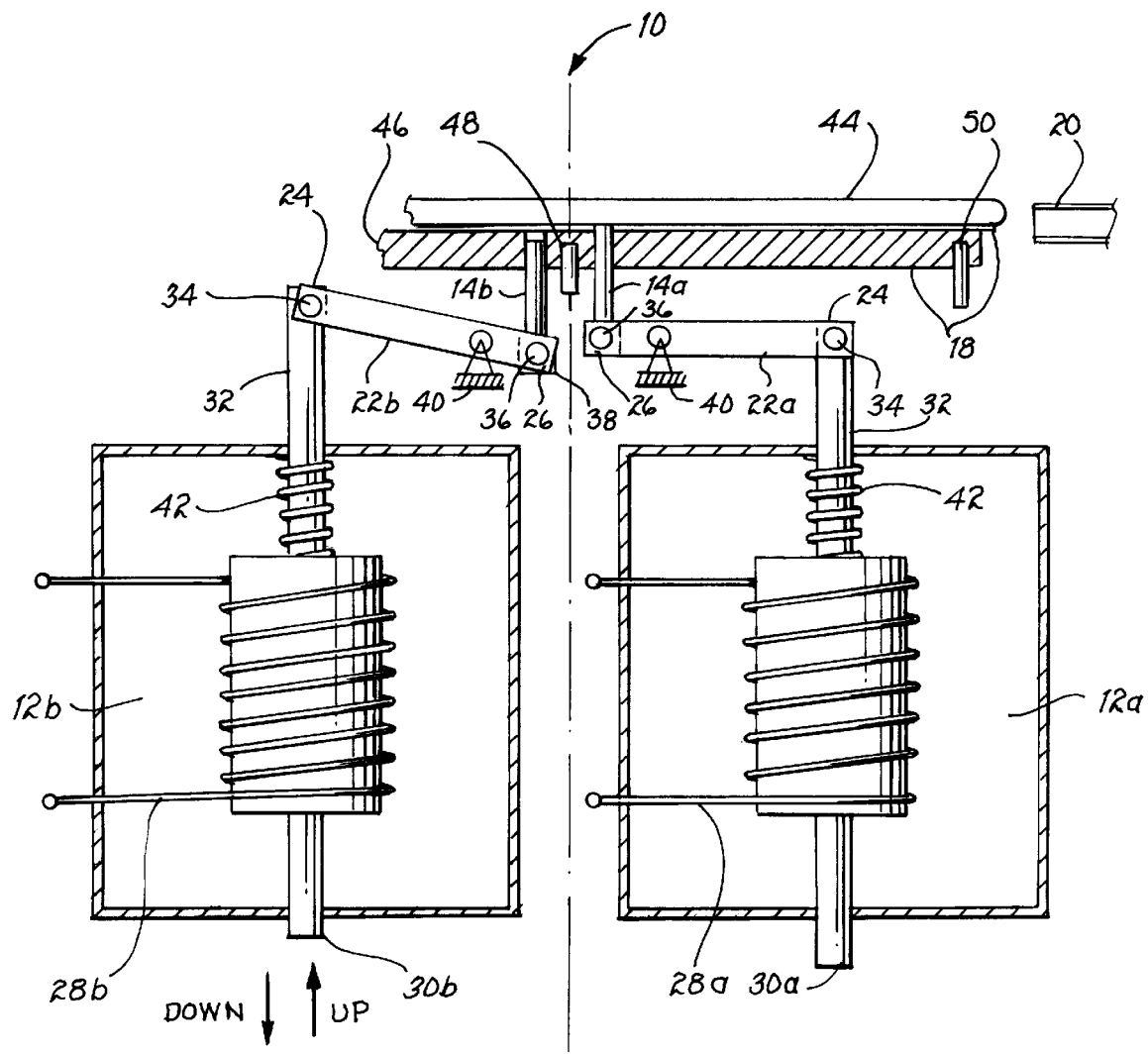
FIG. 1 is a planar view of a high-speed semiconductor chip sluice assembly embodying the invention, illustrating a pair of electromagnets coupled by a lever assembly to a pair of stoppers for controlling movement thereof to regulate the flow one at a time of at least one semiconductor chip through a slide, the electromagnets shown in cross-section to reveal a kernel, coil and spring assembly.

As shown in the drawings for purposes of illustration, the present invention is concerned with an improved high speed semiconductor chip sluice assembly, generally designated in the accompanying drawings by the reference number 10. The method for passing at least one semiconductor chip therethrough is also provided. The high-speed semiconductor chip sluice assembly 10 comprises, generally, a pair of electromagnets 12a and 12b coupled to a pair of stoppers 14a and 14b for controlling movement thereof to regulate the flow one semiconductor chip at a time of at least one semiconductor chip 16 through a slide 18 into or from a tube 20.

In accordance with the present invention, and as illustrated with respect to a preferred embodiment in FIGS. 1–3, the high-speed semiconductor chip sluice assembly 10 enables a sluice assembly cycle to be completed in less than about 0.15 seconds which makes it fast enough to handle one semiconductor chip at a time in high speed systems, makes it possible to handle any number of semiconductor chips and substantially eliminates the risk of the semiconductor chips jamming in the slide.

As illustrated in FIG. 1, the electromagnets 12a and 12b are coupled to the stoppers 14a and 14b by a pair of levers 22a and 22b. The levers 22a and 22b permit the stoppers 14a and 14b to be placed as close to each other as is needed for the smallest semiconductor chips since the electromagnets 12a and 12b are relatively large. Electromagnet 12a is coupled to stopper 14a by lever 22a. Electromagnet 12b is coupled to stopper 14b by lever 22b. Each of the levers 22a and 22b include a first end 24 and a second end 26.

As further illustrated in FIG. 1, the electromagnet 12a includes a coil 28a and an associated kernel 30a. The electromagnet 12b includes a coil 28b and an associated kernel 30b. An upper end 32 of each of the kernels 30a and 30b is connected by a first hinge pin 34 to the first end 24 of each of the levers 22a and 22b. The second end 26 of each of the levers 22a and 22b is connected by a second hinge pin 36 to a lower end 38 of each of the stoppers 14a and 14b. Each of the levers 22a and 22b include a turning point 40 which is connected to a fixed point making it possible to rotate the levers 22a and 22b.

The kernels 30a and 30b move substantially vertically into and out of their associated coils in a sequence as described hereinafter. Movement of the kernel out of the coil causes downward movement of the coupled stopper. Movement of the kernel into the associated coil causes upward movement of the coupled stopper. Kernel movement may be controlled by placing an electrical current on the associated coil, the direction of kernel movement dependent on the direction of current. Kernel movement into the coil may also be controlled by turning off the current and using a mechanical spring 42 around each kernel. A spring 42 is preferred, as no computer control is required.

The kernels 30a and 30b and stoppers 14a and 14b move up or down in the direction of their center line. The levers 22a and 22b rotate around the turning point 40. If the kernel is down, the stopper is up and the lever is in the position that belongs to the aforementioned kernel and stopper position. When the kernel moves up (in the center line direction), the lever first end 24 moves up, the lever second end 26 moves down and the stopper moves down (in the center line direction). The lever first end 24 to which the kernel is coupled and the lever second end 26 to which the stopper is coupled move in a circle. This means that the coupling of the kernel and the lever first end 24 and the coupling of the lever second end 26 to the stopper need to have freedom to move perpendicular to the kernel and stopper moving direction.

In alternate embodiments, actuator means other than electromagnets may be used for driving the stoppers up and down to let through one semiconductor chip at a time in the handling of more than one semiconductor chip in a row. For example, hydraulic, pneumatic, mechanical or electrical actuator means may be used.

The slide 18 includes a conventional top and bottom guide 44 and 46 to prevent the semiconductor chip 16 from moving in any other direction other than the one to or from the tube 20.

The sluice assembly includes a first and second sensor 48 and 50 to check the presence of a semiconductor chip 16 in the slide 18. The first sensor 48 of the pair of sensors is located between the pair of stoppers 14a and 14b. If this first sensor 48 detects a semiconductor chip 16, a sluice assembly cycle is started. The second sensor 50 is located at the end of the slide just before the tube. If the second sensor 50 detects a semiconductor chip 16 there, the sluice assembly cycle may start again. A third sensor (not shown) before the sluice assembly detects overflow of semiconductor chips 16 in the slide by detecting the presence of semiconductor chips for too long a time. If the semiconductor chip is present for longer than a particular time, an overflow condition is indicated and can be remedied.

A method for passing at least one semiconductor chip in a row one at a time through a semiconductor chip sluice assembly comprises the steps of providing at least one semiconductor chip in a row of semiconductor chips; applying electrical current sequentially to a first electromagnet to move a first stopper and to a second electromagnet to move a second stopper to close a portion of the slide to prevent passage of the at least one semiconductor chip therein; and removing electrical current sequentially to a first electromagnet to move a first stopper and to a second electromagnet to move a second stopper by a spring to permit passage of the at least one semiconductor chip in a portion of the slide.

Operation of the high-speed semiconductor chip sluice assembly is shown by example in FIGS. 2A–2G and 3A–3M. The figures show the handling of one row of semiconductor chips 16 after they are separated from their leadframe (not shown) and moved into their magazine (tube) 20. FIGS. 2A–G (single semiconductor chip) show different sequential positions of the stoppers 14a and 14b, in one sluice assembly cycle, of the same sluice assembly. FIGS. 3A–M (two semiconductor chips) show different sequential positions of the stoppers 14a and 14b in two sluice assembly cycles, of the same sluice assembly. "Sequential" in this application means in these particular sequences. When there are more than two semiconductor chips 16 per row, the sluice assembly cycle will be repeated until all semiconductor chips move through the sluice. When there are more rows of semiconductor chips (e.g. a matrix leadframe), there are more sluice assemblies and more stoppers 14a and 14b. With more semiconductor chip rows, all of the stoppers 14a are coupled to one of the pair of electromagnets 12a and all of the stoppers 14b are coupled to the other of the pair of electromagnets 12b. In a one row leadframe, the semiconductor chips can be placed behind each other in relation to the moving direction. With a matrix leadframe, there can be semiconductors next to each other perpendicular to the moving direction.

FIG. 2A shows the "home" position when the sluice assembly is empty, the stopper 14a is up and the stopper 14b is down. At the second position (FIG. 2B), the single semiconductor chip 16 moves in the sluice assembly 10 until up against the stopper 14a. At the third position (FIG. 2C), the stopper 14b moves up to prevent another semiconductor chip from passing the sluice assembly when the stopper 14a moves down. At the fourth position (FIG. 2D), the stopper 14a moves down to open the sluice assembly. At the fifth position (FIG. 2E), the semiconductor chip leaves the sluice assembly and moves into the tube 20. At the sixth position (FIG. 2F), the stopper 14a moves up to prevent another semiconductor chip from passing the sluice when the stopper 14b moves down. At the seventh position (FIG. 2G), the stopper 14b moves down bringing the system back to home and completing one sluice assembly cycle.

Figure 3A:
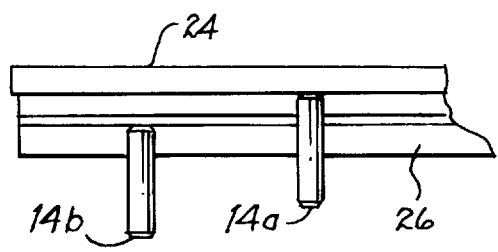
FIGS. 3A–M are operational planar views illustrating different sequential positions of the stoppers in two sluice assembly cycles, of the same sluice assembly as an exemplary two semiconductor chips in one row move through the slide one at a time into the tube.
Figure 3B:
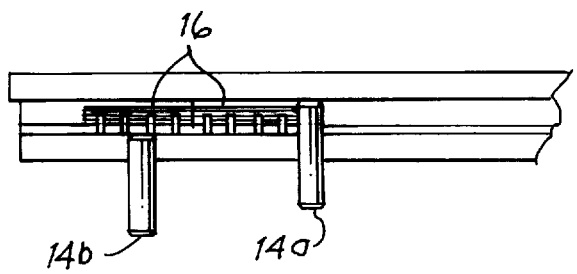
Figure 3C:
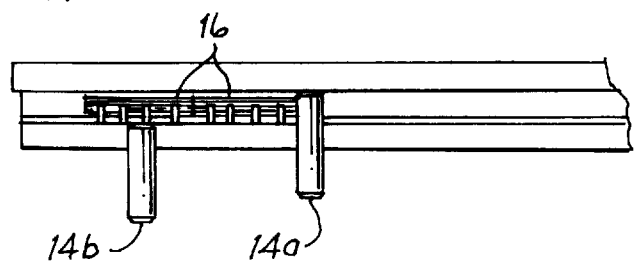
Figure 3D:
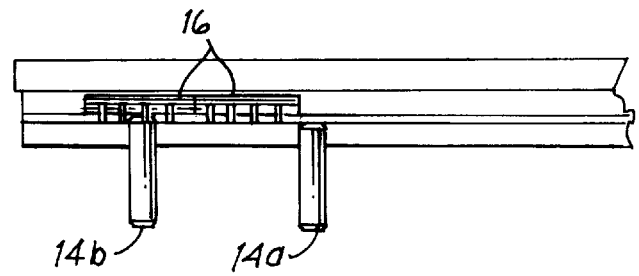
Figure 3E:
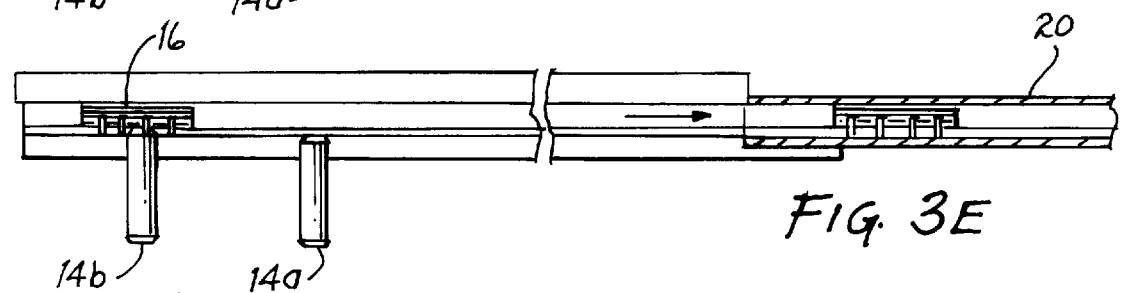
Figure 3F:
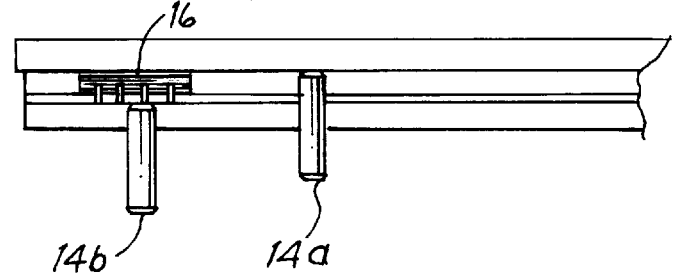
Figure 3G:
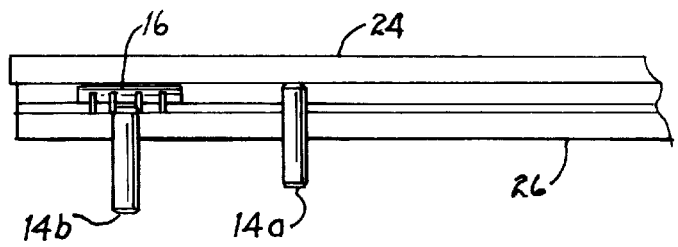
Figure 3H:
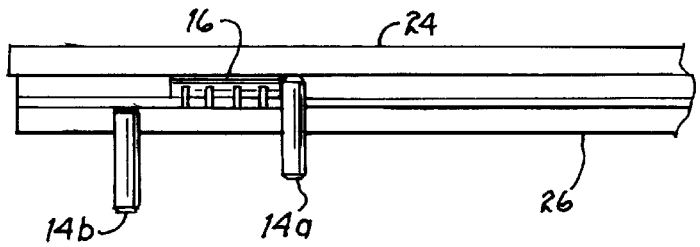
Figure 3I:
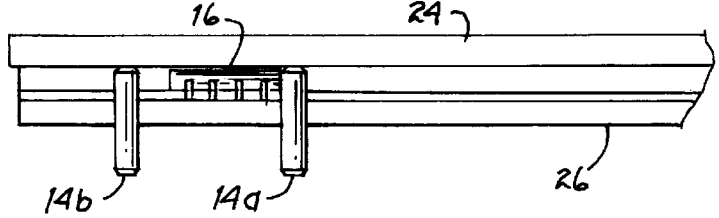
Figure 3J:
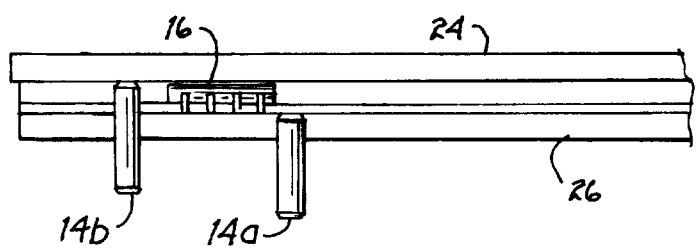
Figure 3K:
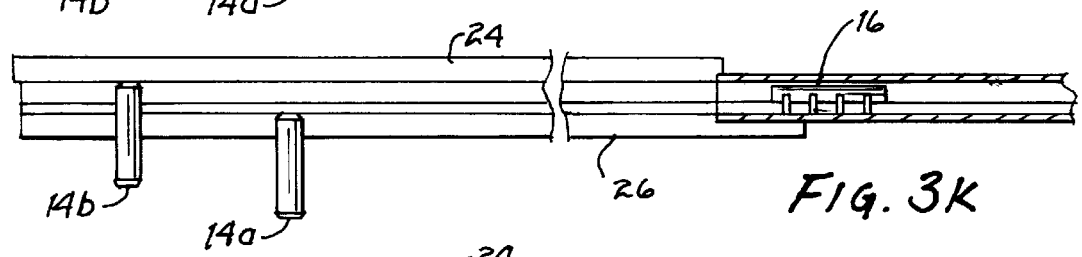
Figure 3L:
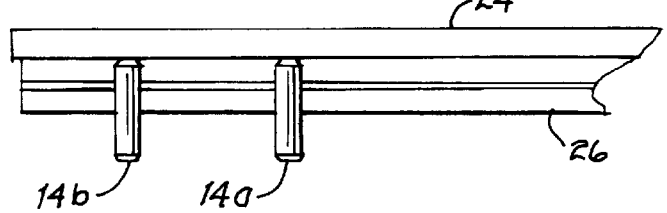
Figure 3M:
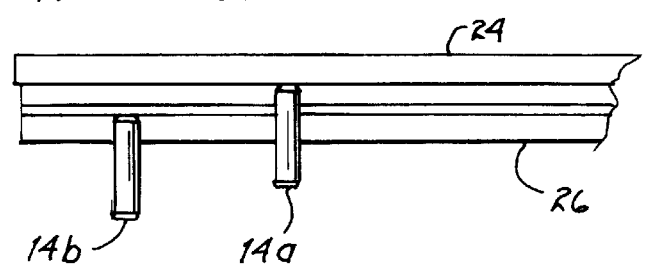

FIG. 3A shows the "home" position when the stopper 14a is up, the stopper 14b is down and the sluice is empty. At position two (FIG. 3B), the semiconductor chips (in this example, two) move to the sluice assembly until the first semiconductor chip is at the stopper 14a. At position three (FIG. 3C), the stopper 14b moves up and clamps the second semiconductor chip to prevent its passage when the stopper 14a moves down. At position four (FIG. 3D), the stopper 14a opens the sluice assembly by moving down. At position five (FIG. 3E), the first semiconductor chip leaves the sluice assembly and moves into the tube 20. At position six (FIG. 3F), the stopper 14a moves up to prevent the second semiconductor chip from passing the sluice assembly without control when the stopper 14b moves down. At position seven (FIG. 3G), the stopper 14b moves down so the second semiconductor chip can move to the stopper 14a. At position eight (FIG. 3H), the second semiconductor chip moves until the stopper 14a. At position nine (FIG. 3I), the stopper 14b moves up to avoid any newcoming semiconductor chip to pass the sluice assembly 10 without control when the stopper 14a is down. At position ten (FIG. 3J), the stopper 14a opens the sluice assembly by moving down. At position eleven (FIG. 3K), the second semiconductor chip 16 leaves the sluice assembly and moves into the tube 20. At position twelve (FIG. 3L), the stopper 14a moves up to avoid any newcoming semiconductor chip 16 to pass the sluice assembly without control when the stopper 14b moves down. At position thirteen (FIG. 3M), the stopper 14b brings the sluice assembly back to the "home" position by moving down. Two sluice assembly cycles have been completed for moving two semiconductor chips 16 into the tube 20.

It is to be appreciated that actuator means other than electromagnets may also be used in the method of the invention. For example, hydraulic, pneumatic, mechanical or electrical actuator means may also be used to drive the stoppers up and down.

From the foregoing, it is to be further appreciated that the high-speed semiconductor chip sluice assembly 10 and method of the present invention enable a sluice assembly cycle to be completed in less than about 0.15 seconds which makes it fast enough to handle one semiconductor chip at a time in high speed systems, makes it possible to handle any number of semiconductor chips and substantially prevents the risk of the semiconductor chips jamming undetected in the slide. In addition, the high-speed sluice assembly enables the operator to count the number of semiconductor chips passing in the system and to substantially guarantee the number of semiconductor chips in the tube.

Although a particular embodiment of the invention has been described in detail for purposes of illustration, various modifications may be made without departing from the spirit and scope of the invention. Accordingly, the invention is not to be limited, except as by the appended claims.

What is claimed is:

1. A semiconductor chip sluice assembly, comprising:
   a slide for transporting a semiconductor device, the slide comprising a top guide and a bottom guide for directing movement of the semiconductor chip, wherein the top guide and the bottom guide are stationary, the bottom guide comprising:
   a first aperture; and
   a second aperture;
   a first stopper for controlling the transporting of the semiconductor device, wherein the first stopper moves vertically through the first aperture in the bottom guide;
   a first actuator coupled to the first stopper for controlling the vertical movement of the first stopper;
   a second stopper for controlling the transporting of the semiconductor device, wherein the second stopper moves vertically through the second aperture in the bottom guide;
   a second actuator coupled to the second stopper for controlling the vertical movement of the second stopper;
   a first sensor coupled to the slide in between the first stopper and the second stopper for detecting the presence of the semiconductor device; and
   a second sensor coupled to the slide for further detecting the presence of the semiconductor device.

2. The assembly in accordance with claim 1 wherein the first stopper is independently controlled from the second stopper.

3. The assembly in accordance with claim 1 wherein the first actuator is independently controlled from the second actuator.

4. The assembly in accordance with claim 1 wherein the first actuator causes the first stopper to move upwards through the first aperture to prevent the semiconductor device from being transported along the slide.

5. The assembly in accordance with claim 1 wherein the first actuator causes the first stopper to move downwards through the first aperture to permit the semiconductor device to be transported along the slide.

6. The assembly in accordance with claim 1 wherein the second actuator causes the second stopper to move upwards through the second aperture to prevent the semiconductor device from being transported.

7. The assembly in accordance with claim 1 wherein the second actuator causes the second stopper to move downwards through the second aperture to permit the semiconductor device to be transported along the slide.

8. The assembly in accordance with claim 1 wherein the first stopper and the second stopper are simultaneously in an up position to prevent the semiconductor device from being transported along the slide.

9. The assembly in accordance with claim 1 wherein the first stopper and the second stopper are simultaneously in a down position to permit the semiconductor device to be transported along the slide.

10. The assembly in accordance with claim 1 wherein the first actuator controls the first stopper to an up position while nearly simultaneously the second actuator controls the second stopper to a down position.

11. The assembly in accordance with claim 1 wherein the first actuator controls the first stopper to an down position while nearly simultaneously the second actuator controls the second stopper to an up position.

12. A method for transporting a semiconductor device in a sluice assembly comprising the steps of:

setting a first stopper to a down position with respect to a slide, the slide comprising a top guide and a bottom guide for directing movement of the semiconductor chip, wherein the top guide and the bottom guide are stationary;

setting a second stopper to an up position with respect to the slide wherein movement of the second stopper is independently controlled from movement of the first stopper;

transporting a first semiconductor device along the slide such that the first semiconductor device passes over the first stopper and contacts the second stopper such that transport of the first semiconductor device along the slide is prevented by the second stopper;

setting the first stopper in an up position with respect to the slide such that transport of a second semiconductor device along the slide is prevented by the first stopper;

setting the second stopper in a down position with respect to the slide such that transport of the first semiconductor device along the slide continues; and setting the second stopper to an up position with respect to the slide.

13. The method in accordance with claim 12 further comprising the step of providing a sensor coupled to the slide for determining position of the first semiconductor device.

14. A method for transporting a semiconductor device in a sluice assembly comprising the steps of:

setting a first stopper to a down position with respect to a slide, the slide comprising a top guide and a bottom guide for directing movement of the semiconductor chip, wherein the top guide and the bottom guide are stationary;

setting a second stopper to an up position with respect to the slide wherein movement of the second stopper is independently controlled from movement of the first stopper;

transporting a first semiconductor device along the slide such that the first semiconductor device passes over the first stopper and contacts the second stopper such that transport of the first semiconductor device along the slide is prevented by the second stopper;

transporting a second semiconductor device along the slide directly behind the first semiconductor device such that the second semiconductor device contacts the first semiconductor device and transport of the second semiconductor device is prevented by the first semiconductor device and by the second stopper;

setting the first stopper in an up position with respect to the slide such that the first stopper clamps the second semiconductor device to a portion of the slide;

setting the second stopper in a down position with respect to the slide such that transport of the first semiconductor device along the slide continues;

setting the second stopper to an up position with respect to the slide;

setting the first stopper to a down position with respect to the slide such that transport of the second semiconductor device along the slide continues until the second semiconductor device contacts the second stopper;

setting the first stopper to an up position with respect to the slide such that transport of a third semiconductor device is prevented by the first stopper;

setting the second stopper to a down position with respect to the slide such that transport of the second semiconductor device along the slide continues; and setting the second stopper to an up position with respect to the slide.

15. The method in accordance with claim 14 further comprising the step of providing a sensor coupled to the slide for determining position of the first semiconductor device.

* * * * *